US012051990B2

(12) United States Patent
Peterson et al.

(10) Patent No.: US 12,051,990 B2
(45) Date of Patent: Jul. 30, 2024

(54) INTEGRATED PHOTOVOLTAIC ROOFING SHINGLES, METHODS, SYSTEMS, AND KITS THEREOF

(71) Applicant: GAF Energy LLC, Parsippany, NJ (US)

(72) Inventors: Nathan Peterson, Oakland, CA (US); Richard Perkins, San Jose, CA (US); Alex Sharenko, Berkeley, CA (US); Gabriela Bunea, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/966,618

(22) Filed: Oct. 14, 2022

(65) Prior Publication Data

US 2023/0143939 A1    May 11, 2023

Related U.S. Application Data

(63) Continuation of application No. 17/154,809, filed on Jan. 21, 2021, now Pat. No. 11,489,482.
(Continued)

(51) Int. Cl.
*H02S 20/25* (2014.01)
*B32B 37/26* (2006.01)
*H01L 31/048* (2014.01)

(52) U.S. Cl.
CPC .............. *H02S 20/25* (2014.12); *B32B 37/26* (2013.01); *H01L 31/0481* (2013.01); *B32B 2274/00* (2013.01); *B32B 2457/12* (2013.01)

(58) Field of Classification Search
CPC .......... H02S 20/25; H02S 20/23; H02S 20/24
See application file for complete search history.

(56) References Cited

U.S. PATENT DOCUMENTS 1,981,467 A    11/1934  Radtke
3,156,497 A    11/1964  Lessard
(Continued)

FOREIGN PATENT DOCUMENTS

CA    2829440 A    5/2019
CH    700095 A2    6/2010
(Continued)

OTHER PUBLICATIONS

Sunflare, Procducts: "Sunflare Develops Prototype For New Residential Solar Shingles"; 2019 «sunflaresolar.com/news/sunflare-develops-prototype-for-new-residential-solar-shingles» retrieved Feb. 2, 2021.
(Continued)

*Primary Examiner* — Ryan S Cannon
(74) *Attorney, Agent, or Firm* — GREENBERG TRAURIG, LLP

(57) ABSTRACT

Some embodiments of the present disclosure relate to an integrated photovoltaic (PV) roofing shingle comprising a photovoltaic (PV) module and a roofing shingle. In some embodiments, the roofing shingle is bonded to the PV module. In some embodiments, a bond strength between the roofing shingle and the PV module is from 5 N/mm to 60 N/mm tested according to ASTM D1876. In some embodiments, the integrated PV roofing shingle has a mass per unit area of 0.5 lb per square foot to 5 lbs per square foot. Methods, systems, and kits including the integrated PV roofing shingle are also disclosed.

18 Claims, 2 Drawing Sheets

Related U.S. Application Data

(60) Provisional application No. 62/964,451, filed on Jan. 22, 2020.

(56) References Cited

U.S. PATENT DOCUMENTS

| | | | |
|---|---|---|---|
| 4,258,948 A | 3/1981 | Hoffmann | |
| 4,349,220 A | 9/1982 | Carroll et al. | |
| 4,499,702 A | 2/1985 | Turner | |
| 4,636,577 A | 1/1987 | Peterpaul | |
| 5,167,579 A | 12/1992 | Rotter | |
| 5,437,735 A | 8/1995 | Younan et al. | |
| 5,590,495 A | 1/1997 | Bressler et al. | |
| 5,642,596 A | 7/1997 | Waddington | |
| 6,008,450 A | 12/1999 | Ohtsuka et al. | |
| 6,033,270 A | 3/2000 | Stuart | |
| 6,046,399 A | 4/2000 | Kapner | |
| 6,320,114 B1 | 11/2001 | Kuechler | |
| 6,320,115 B1 | 11/2001 | Kataoka et al. | |
| 6,336,304 B1 | 1/2002 | Mimura et al. | |
| 6,341,454 B1 | 1/2002 | Koleoglou | |
| 6,407,329 B1 | 6/2002 | Iino et al. | |
| 6,576,830 B2 | 6/2003 | Nagao et al. | |
| 6,928,781 B2 | 8/2005 | Desbois et al. | |
| 6,972,367 B2 | 12/2005 | Federspiel et al. | |
| 7,138,578 B2 | 11/2006 | Komamine | |
| 7,155,870 B2 | 1/2007 | Almy | |
| 7,178,295 B2 | 2/2007 | Dinwoodie | |
| 7,487,771 B1 | 2/2009 | Eiffert et al. | |
| 7,587,864 B2 | 9/2009 | McCaskill et al. | |
| 7,666,491 B2 | 2/2010 | Yang et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Podirsky | |
| 7,832,176 B2 | 11/2010 | McCaskill et al. | |
| 8,118,109 B1 | 2/2012 | Hacker | |
| 8,168,880 B2 | 5/2012 | Jacobs et al. | |
| 8,173,889 B2 | 5/2012 | Kalkanoglu et al. | |
| 8,210,570 B1 | 7/2012 | Railkar et al. | |
| 8,276,329 B2 | 10/2012 | Lenox | |
| 8,312,693 B2 | 11/2012 | Cappelli | |
| 8,319,093 B2 | 11/2012 | Kalkanoglu et al. | |
| 8,333,040 B2 | 12/2012 | Shiao et al. | |
| 8,371,076 B2 | 2/2013 | Jones et al. | |
| 8,375,653 B2 | 2/2013 | Shiao et al. | |
| 8,404,967 B2 | 3/2013 | Kalkanoglu et al. | |
| 8,410,349 B2 | 4/2013 | Kalkanoglu et al. | |
| 8,418,415 B2 | 4/2013 | Shiao et al. | |
| 8,438,796 B2 | 5/2013 | Shiao et al. | |
| 8,468,754 B2 | 6/2013 | Railkar et al. | |
| 8,468,757 B2 | 6/2013 | Krause et al. | |
| 8,505,249 B2 | 8/2013 | Geary | |
| 8,512,866 B2 | 8/2013 | Taylor | |
| 8,513,517 B2 | 8/2013 | Kalkanoglu et al. | |
| 8,586,856 B2 | 11/2013 | Kalkanoglu et al. | |
| 8,601,754 B2 | 12/2013 | Jenkins et al. | |
| 8,623,499 B2 | 1/2014 | Viasnoff | |
| 8,629,578 B2 | 1/2014 | Kurs et al. | |
| 8,646,228 B2 | 2/2014 | Jenkins | |
| 8,656,657 B2 | 2/2014 | Livsey et al. | |
| 8,671,630 B2 | 3/2014 | Lena et al. | |
| 8,677,702 B2 | 3/2014 | Jenkins | |
| 8,695,289 B2 | 4/2014 | Koch et al. | |
| 8,713,858 B1 | 5/2014 | Xie | |
| 8,713,860 B2 | 5/2014 | Railkar et al. | |
| 8,733,038 B2 | 5/2014 | Kalkanoglu et al. | |
| 8,789,321 B2 | 7/2014 | Ishida | |
| 8,793,940 B2 | 8/2014 | Kalkanoglu et al. | |
| 8,793,941 B2 | 8/2014 | Bosler et al. | |
| 8,826,607 B2 | 9/2014 | Shiao et al. | |
| 8,835,751 B2 | 9/2014 | Kalkanoglu et al. | |
| 8,863,451 B2 | 10/2014 | Jenkins et al. | |
| 8,898,970 B2 | 12/2014 | Jenkins et al. | |
| 8,925,262 B2 | 1/2015 | Railkar et al. | |
| 8,943,766 B2 | 2/2015 | Gombarick et al. | |
| 8,946,544 B2 | 2/2015 | Jabos et al. | |
| 8,950,128 B2 | 2/2015 | Kalkanoglu et al. | |
| 8,959,848 B2 | 2/2015 | Jenkins et al. | |
| 8,966,838 B2 | 3/2015 | Jenkins | |
| 8,966,850 B2 | 3/2015 | Jenkins et al. | |
| 8,994,224 B2 | 3/2015 | Mehta et al. | |
| 9,032,672 B2 | 5/2015 | Livsey et al. | |
| 9,145,498 B2 | 9/2015 | Ultsch | |
| 9,166,087 B2 | 10/2015 | Chihlas et al. | |
| 9,169,646 B2 | 10/2015 | Rodrigues et al. | |
| 9,170,034 B2 | 10/2015 | Bosler et al. | |
| 9,178,465 B2 | 11/2015 | Shiao et al. | |
| 9,202,955 B2 | 12/2015 | Livsey et al. | |
| 9,212,832 B2 | 12/2015 | Jenkins | |
| 9,217,584 B2 | 12/2015 | Kalkanoglu et al. | |
| 9,270,221 B2 | 2/2016 | Zhao | |
| 9,273,885 B2 | 3/2016 | Rordigues et al. | |
| 9,276,141 B2 | 3/2016 | Kalkanoglu et al. | |
| 9,331,224 B2 | 5/2016 | Koch et al. | |
| 9,356,174 B2 | 5/2016 | Duarte et al. | |
| 9,359,014 B1 | 6/2016 | Yang et al. | |
| 9,412,890 B1 | 8/2016 | Meyers | |
| 9,528,270 B2 | 12/2016 | Jenkins et al. | |
| 9,605,432 B1 | 3/2017 | Robbins | |
| 9,670,353 B2 | 6/2017 | Peng et al. | |
| 9,711,672 B2 | 7/2017 | Wang | |
| 9,711,991 B2 | 7/2017 | Hall et al. | |
| 9,755,573 B2 | 9/2017 | Livsey et al. | |
| 9,786,802 B2 | 10/2017 | Shiao et al. | |
| 9,831,818 B2 | 11/2017 | West | |
| 9,912,284 B2 | 3/2018 | Svec | |
| 9,920,515 B2 | 3/2018 | Xing et al. | |
| 9,923,515 B2 | 3/2018 | Rodrigues et al. | |
| 9,938,729 B2 | 4/2018 | Coon | |
| 9,987,786 B2 | 6/2018 | Stolijkovic et al. | |
| 9,991,412 B2 | 6/2018 | Gonzalez et al. | |
| 9,998,067 B2 | 6/2018 | Kalkanoglu et al. | |
| 10,015,933 B2 | 7/2018 | Boldrin | |
| 10,027,273 B2 | 7/2018 | West et al. | |
| 10,115,850 B2 | 10/2018 | Rodrigues et al. | |
| 10,128,660 B1 | 11/2018 | Apte et al. | |
| 10,156,075 B1 | 12/2018 | McDonough | |
| 10,179,852 B2 | 1/2019 | Gossi et al. | |
| 10,187,005 B2 | 1/2019 | Rodrigues et al. | |
| 10,256,765 B2 | 4/2019 | Rodrigues et al. | |
| 10,284,136 B1 | 5/2019 | Mayfield et al. | |
| 10,454,408 B2 | 10/2019 | Livsey et al. | |
| 10,480,192 B2 | 11/2019 | Xing et al. | |
| 10,530,292 B1 | 1/2020 | Cropper et al. | |
| 10,560,048 B2 | 2/2020 | Fisher et al. | |
| 10,563,406 B2 | 2/2020 | Kalkanoglu et al. | |
| D879,031 S | 3/2020 | Lance et al. | |
| 10,669,414 B2 | 6/2020 | Li et al. | |
| 10,784,813 B2 | 9/2020 | Kalkanoglu et al. | |
| D904,289 S | 12/2020 | Lance et al. | |
| 10,907,355 B2 | 2/2021 | Hubbard et al. | |
| 10,914,063 B2 | 2/2021 | Lee et al. | |
| RE48,555 E | 5/2021 | Cancio et al. | |
| 11,012,026 B2 | 5/2021 | Kalkanoglu et al. | |
| 11,015,085 B2 | 5/2021 | Bruns et al. | |
| 11,065,849 B2 | 7/2021 | Ackermann et al. | |
| 11,177,639 B1 | 11/2021 | Nguyen et al. | |
| 11,217,715 B2 | 1/2022 | Sharenko et al. | |
| 11,251,744 B1 | 2/2022 | Bunea et al. | |
| 11,258,399 B2 | 2/2022 | Kalkanoglu et al. | |
| 11,283,394 B2 | 3/2022 | Perkins et al. | |
| 11,424,379 B2 | 8/2022 | Sharenko et al. | |
| 11,431,280 B2 | 8/2022 | Liu et al. | |
| 11,431,281 B2 | 8/2022 | Perkins et al. | |
| 2001/0054262 A1 | 12/2001 | Nath et al. | |
| 2002/0053360 A1 | 5/2002 | Kinoshita et al. | |
| 2002/0129849 A1 | 9/2002 | Heckeroth | |
| 2003/0101662 A1 | 6/2003 | Ullman | |
| 2003/0132265 A1 | 7/2003 | Villela et al. | |
| 2003/0217768 A1 | 11/2003 | Guha | |
| 2005/0030187 A1 | 2/2005 | Peress et al. | |
| 2005/0115603 A1 | 6/2005 | Yoshida et al. | |
| 2005/0144870 A1 | 7/2005 | Dinwoodie | |

(56) References Cited

U.S. PATENT DOCUMENTS

| | | |
|---|---|---|
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0205270 A1 | 8/2009 | Shaw et al. |
| 2009/0229652 A1 | 9/2009 | Mapel et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0238468 A1 | 8/2014 | Brounne |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0024159 A1 | 1/2015 | Bess et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0203555 A1 | 7/2017 | Wang et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0094439 A1 | 4/2018 | Wang et al. |
| 2018/0097472 A1 | 4/2018 | Anderson et al. |
| 2018/0115275 A1 | 4/2018 | Flanigan et al. |
| 2018/0219512 A1 | 8/2018 | Langmaid et al. |
| 2018/0254738 A1 | 9/2018 | Yang et al. |
| 2018/0281347 A1 | 10/2018 | Gossi |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0020819 A1 | 1/2020 | Farhangi |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0002898 A1 | 1/2021 | Knebel et al. |
| 2021/0095474 A1 | 4/2021 | Yang et al. |
| 2021/0113970 A1 | 4/2021 | Stainer et al. |
| 2021/0115223 A1 | 4/2021 | Bonekamp et al. |
| 2021/0159353 A1 | 5/2021 | Li et al. |
| 2021/0171808 A1 | 6/2021 | Ackermann et al. |
| 2021/0172174 A1 | 6/2021 | Ackermann et al. |
| 2021/0343886 A1 | 11/2021 | Sharenko et al. |
| 2022/0149213 A1 | 5/2022 | Mensink et al. |

FOREIGN PATENT DOCUMENTS

| | | | |
|---|---|---|---|
| CN | 202797032 U | 3/2013 | |
| DE | 1958248 A1 | 11/1971 | |
| EP | 1039361 A1 | 9/2000 | |
| EP | 1837162 A1 | 9/2007 | |
| EP | 1774372 A1 | 7/2011 | |
| EP | 2446481 A2 | 5/2012 | |
| EP | 2784241 A1 | 10/2014 | |
| EP | 3154190 B1 | 8/2019 | |
| JP | 10046767 A | 2/1998 | |
| JP | 2002-106151 A | 4/2002 | |
| JP | 2001-098703 A | 10/2002 | |
| JP | 2017-027735 A | 2/2017 | |
| JP | 2018053707 A | 4/2018 | |
| KR | 20090044060 A | 8/2009 | |
| KR | 10-2019-0000367 A1 | 1/2019 | |
| KR | 10-2253483 B1 | 5/2021 | |
| NL | 2026856 B1 | 6/2022 | |
| WO | WO-2010151777 A2 * | 12/2010 | ............ E04D 1/20 |
| WO | 2011/049944 A1 | 4/2011 | |
| WO | 2015/133632 A1 | 9/2015 | |
| WO | 2019/201416 A1 | 10/2019 | |
| WO | 2020-159358 A1 | 8/2020 | |
| WO | 2021-247098 A1 | 12/2021 | |

OTHER PUBLICATIONS

RGS Energy, 3.5kW POWERHOUSE 3.0 system installed in an afternoon; Jun. 7, 2019 «facebook.com/RGSEnergy/» retrieved Feb. 2, 2021.

(56) References Cited

OTHER PUBLICATIONS

Tesla, Solar Roof «tesla.com/solarroof» retrieved Feb. 2, 2021.
"Types of Roofing Underlayment", Owens Corning Roofing; «https://www.owenscorning.com/en-us/roofing/tools/how-roofing-underlayment-helps-protect-your-home» retrieved Nov. 1, 2021.

* cited by examiner

INTEGRATED PHOTOVOLTAIC ROOFING SHINGLES, METHODS, SYSTEMS, AND KITS THEREOF

CROSS-REFERENCE TO RELATED APPLICATION

This application is a continuation of U.S. patent application Ser. No. 17/154,809, filed on Jan. 21, 2021, entitled "INTEGRATED PHOTOVOLTAIC ROOFING SHINGLES, METHODS, SYSTEMS, AND KITS THEREOF," which claims the benefit of U.S. Provisional Application Ser. No. 62/964,451, filed on Jan. 22, 2020, entitled "INTEGRATED PHOTOVOLTAIC ROOFING SHINGLES, METHODS, SYSTEMS, AND KITS THEREOF," the contents of which are incorporated herein by reference in their entirety.

FIELD

The present disclosure relates to integration of photovoltaic (PV) panels into roofing shingles.

BACKGROUND

Traditional rooftop photovoltaic (PV) systems require a large amount of installation labor, as well as specialized tools and methods. Mechanisms to reduce the amount of labor and limit specific requirements for installing PV by making the installation more similar to that of a rooftop shingle are needed.

SUMMARY

Covered embodiments are defined by the claims, not this summary. This summary is a high-level overview of various aspects and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

Some embodiments of the present disclosure relate to an integrated photovoltaic (PV) roofing shingle comprising: a photovoltaic (PV) module; and a roofing shingle, wherein the roofing shingle is bonded to the PV module; wherein a bond strength between the roofing shingle and the PV module is from 5 N/mm to 60 N/mm tested according to ASTM D1876 wherein the integrated PV roofing shingle has a mass per unit area of 0.5 lb per square foot to 5 lbs per square foot.

In some embodiments, the roofing shingle is bonded to the PV module by at least one adhesive.

In some embodiments, the roofing shingle is a polymer-coated shingle, an asphalt-coated shingle, or a combination thereof.

In some embodiments, the polymer-coated shingle comprises thermoplastic polyolefin.

In some embodiments, the PV module comprises at least one of: a substrate, wherein the substrate forms at least a portion of a bottom surface of the PV module; a superstrate, wherein the superstrate forms at least a portion of a top surface of the PV module; or any combination thereof.

In some embodiments, the roofing shingle is bonded to at least one of: the substrate, the superstrate, or any combination thereof.

In some embodiments, the top surface of the PV module comprises: a first portion, wherein the first portion of the top surface of the PV module comprises the superstrate; and a second portion, wherein the second portion of the top surface of the PV module does not comprise the superstrate; wherein the roofing shingle is bonded to the second portion of the top surface of the PV module; and wherein the second portion of the top surface of the PV module is adjacent to the first portion of the top surface of the PV module.

In some embodiments, the bottom surface of the PV module does not comprise a substrate, and wherein the roofing shingle is bonded to the bottom surface.

Some embodiments of the present disclosure relate to a method comprising: obtaining a photovoltaic (PV) module and a roofing shingle; bonding the PV module to the roofing shingle, so as to form an integrated PV roofing shingle having a bond strength, between the roofing shingle and the PV module of from 5 N/mm to 60 N/mm tested according to ASTM D1876; and wherein the integrated PV roofing shingle has a mass per unit area of 0.5 lb per square foot to 5 lbs per square foot.

In some embodiments, the bonding step comprises laminating the PV module to the roofing shingle.

In some embodiments, the bonding step comprises bonding the PV module to the roofing shingle with a sufficient amount of bonding material.

Some embodiments of the present disclosure relate to a method comprising: obtaining an integrated PV roofing shingle comprising: a photovoltaic (PV) module; and a roofing shingle, wherein the roofing shingle is bonded to the PV module; wherein a bond strength between the roofing shingle and the PV module is from 5 N/mm to 60 N/mm tested according to ASTM D1876; wherein the integrated PV roofing shingle has a mass per unit area of 0.5 lb per square foot to 5 lbs per square foot; and affixing the integrated PV roofing shingle to a roof.

In some embodiments, the affixing step comprises affixing the integrated PV roofing shingle to the roof using at least one fastener.

In some embodiments, the at least one fastener is chosen from at least one nail, at least one screw, at least one staple, or any combination thereof.

In some embodiments, the integrated PV roofing shingle has 1 fastener to 5 fasteners per square foot of the integrated PV roofing shingle after the affixing step.

In some embodiments, the fastener is affixed to the roof by driving the fastener through an overlapping area of the integrated PV roofing shingle and into the roof.

Some embodiments of the present disclosure relate to a roofing kit comprising: a plurality of integrated PV roofing shingles, wherein each integrated PV roofing shingle of the plurality of integrated PV roofing shingles comprises: a photovoltaic (PV) module; and a roofing shingle, wherein each roofing shingle of the plurality is bonded to a corresponding PV module; wherein a bond strength between each roofing shingle and each corresponding PV module of the plurality is from 5 N/mm to 60 N/mm tested according to ASTM D1876; wherein each integrated PV roofing shingle of the plurality has a mass per unit area of 0.5 lb per square foot to 5 lbs per square foot; and wherein each integrated PV roofing shingle of the plurality is configured to be affixed to a roof by at least one fastener.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
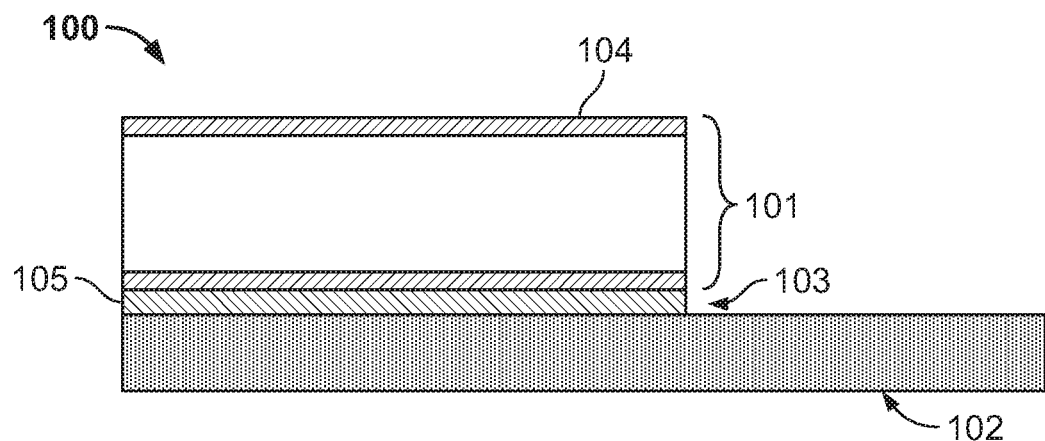
FIGS. 1-4 are non-limiting embodiments, in cross sectional views, of exemplary integrated PV roofing shingles according to the present disclosure.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, terms such as "comprising" "including," and "having" do not limit the scope of a specific claim to the materials or steps recited by the claim.

As used herein, the term "consisting essentially of" limits the scope of a specific claim to the specified materials or steps and those that do not materially affect the basic and novel characteristic or characteristics of the specific claim.

As used herein, terms such as "consisting of" and "composed of" limit the scope of a specific claim to the materials and steps recited by the claim.

All prior patents, publications, and test methods referenced herein are incorporated by reference in their entireties.

As used herein, the term photovoltaic ("PV") module refers to any device that is configured to convert light (e.g., sunlight) into electric power. A non-limiting example of a PV module is a solar panel.

As used herein, the term "integrated PV roofing shingle" or "integrated photovoltaic roofing shingle" refers to a roofing shingle that includes a PV module and a roofing shingle, where the PV module and roofing shingle collectively function a single, stand-alone unit. In some embodiments, the "integrated PV roofing shingle" functions as a single, stand-alone unit regardless of whether the "integrated PV roofing shingle" is installed on a roof. While a single integrated PV roofing shingle may function as a stand-alone unit, this does not preclude, for example, some embodiments where multiple integrated PV roofing shingles function together as a system.

As used herein, the term "bonded" means that two surfaces (e.g., a surface of a PV module and a surface of a roofing shingle) are in sufficient contact with each other to provide any bond strength or range of bond strengths described herein.

As used herein, the term "superstrate" refers to a layer of a material disposed on a top (i.e., sun-facing) portion of a PV module.

As used herein, the term "substrate" refers to a layer of a material disposed on a bottom (i.e., ground-facing) portion of a PV module.

In some embodiments, the layer of material of the substrate, the superstrate, or any combination thereof comprises an insulating moisture resistant polymer, such as, but not limited to thermoplastic polyolefin (TPO), Ethylene tetrafluoroethylene (ETFE), polyolefin encapsulant (POE), ethylene vinyl acetate encapsulant (EVA), and acrylics. In some embodiments, the layer of material of the substrate, the superstrate, or any combination thereof comprises glass.

As used herein, the term "overlapping area" is defined as the multi-layered section of a shingle where a portion of the headlap section of the shingle overlaps and contacts a portion of the lower layer of the shingle. In embodiments, the overlapping portion of the headlap section of the shingle is bonded to the corresponding portion of the lower layer of the shingle. In embodiments, the overlapping portion of the headlap section of the shingle is bonded to the corresponding portion of the lower layer of the shingle using an adhesive, fastener or combination thereof. In some embodiments, the overlapping portion of the headlap section of the shingle is bonded to the corresponding portion of the lower layer of the shingle as detailed in U.S. Pat. No. 8,127,514, which is incorporated by reference in its entirety.

Some embodiments of the present disclosure relate to an integrated PV roofing shingle. In some embodiments, the integrated PV roofing shingle comprises a PV module and a roofing shingle.

In some embodiments, the roofing shingle is bonded to the PV module. In some embodiments, the roofing shingle is bonded to the PV module by laminating the PV module to the roofing shingle. In some embodiments, the roofing shingle is bonded to the PV module by at least one bonding material. In some embodiments, the at least one bonding material comprises at least one adhesive. In embodiments, the at least one adhesive includes at least one of: asphaltic adhesives such as rubber polymer modified asphalt, acrylic adhesives, polyurethane adhesives, silicone adhesives, rubber polymer based adhesives, e.g. SBS, SBR, SEBS and SIS, or any combination thereof.

In some embodiments, a bond strength between the roofing shingle and the PV module is from 5 N/mm to 60 N/mm tested according to ASTM D1876, from 10 N/mm to 60 N/mm according to ASTM D1876, from 15 N/mm to 60 N/mm according to ASTM D1876, from 20 N/mm to 60 N/mm according to ASTM D1876, from 25 N/mm to 60 N/mm according to ASTM D1876, from 30 N/mm to 60 N/mm according to ASTM D1876, from 35 N/mm to 60 N/mm according to ASTM D1876, from 40 N/mm to 60 N/mm according to ASTM D1876, from 45 N/mm to 60 N/mm according to ASTM D1876, from 50 N/mm to 60 N/mm according to ASTM D1876, or from 55 N/mm to 60 N/mm according to ASTM D1876.

In some embodiments, a bond strength between the roofing shingle and the PV module is from 5 N/mm to 55 N/mm tested according to ASTM D1876, from 5 N/mm to 50 N/mm according to ASTM D1876, from 5 N/mm to 45 N/mm according to ASTM D1876, from 5 N/mm to 40 N/mm according to ASTM D1876, from 5 N/mm to 35 N/mm according to ASTM D1876, from 5 N/mm to 30 N/mm according to ASTM D1876, from 5 N/mm to 25 N/mm according to ASTM D1876, from 5 N/mm to 20 N/mm according to ASTM D1876, from 5 N/mm to 15 N/mm according to ASTM D1876, or from 5 N/mm to 10 N/mm according to ASTM D1876.

In some embodiments, a bond strength between the roofing shingle and the PV module is from 10 N/mm to 55 N/mm tested according to ASTM D1876, from 15 N/mm to 50 N/mm according to ASTM D1876, from 20 N/mm to 45 N/mm according to ASTM D1876, from 25 N/mm to 40 N/mm according to ASTM D1876, or from 30 N/mm to 35 N/mm according to ASTM D1876.

In some embodiments, the roofing shingle is an asphalt-coated shingle, a polymer-coated shingle or any combination/mixture thereof. Non-limiting examples of the polymer coatings include, thermoplastic polyolefin (TPO), polyvinyl butyral (rPVB), polytransoctenamer rubber (TOR), ground tire rubber (GTR), wood plastic, poly(methyl methacrylate) (PMMA), polyvinyl chloride (PVC), low density polyethylene (LDPE), high density polyethylene (HDPE), polypropylene (PP), polyethylene terephthalate (PET). Non-limiting examples of asphalt coatings include oxidized asphalt coatings and polymer modified asphalt coatings. Non-limiting examples of polymer modified asphalt coated shingles are described in U.S. Pat. No. 9,493,654, which is incorporated by reference herein in its entirety.

In some embodiments, the integrated PV roofing shingle has a mass per unit area from 0.5 lb per square foot to 5 lbs per square foot, from 0.5 lb per square foot to 4.5 lbs per square foot, 0.5 lb per square foot to 4 lbs per square foot, from 0.5 lb per square foot to 3.5 lbs per square foot, from 0.5 lb per square foot to 3 lbs per square foot, from 0.5 lb per square foot to 2.5 lbs per square foot, from 0.5 lb per square foot to 2 lbs per square foot, from 0.5 lb per square foot to 1.5 lbs per square foot, or from 0.5 lb per square foot to 1 lbs per square foot.

In some embodiments, the integrated PV roofing shingle has a mass per unit area from 1 lb per square foot to 5 lbs per square foot, from 1.5 lb per square foot to 5 lbs per square foot, from 2 lb per square foot to 5 lbs per square foot, from 2.5 lb per square foot to 5 lbs per square foot, from 3 lb per square foot to 5 lbs per square foot, from 3.5 lb per square foot to 5 lbs per square foot, from 4 lb per square foot to 5 lbs per square foot, or from 4.5 lb per square foot to 5 lbs per square foot.

In some embodiments, the integrated PV roofing shingle has a mass per unit area of 1 lbs per square foot to 4.5 lbs per square foot, from 1.5 lb per square foot to 4 lbs per square foot, from 2 lb per square foot to 3.5 lbs per square foot, or from 2.5 lb per square foot to 3 lbs per square foot.

In some embodiments, the PV module comprises at least one of: a substrate, a superstrate, or any combination thereof. In some embodiments, the roofing shingle is bonded to at least one of: the substrate, the superstrate, or any combination thereof.

In some embodiments, the substrate forms at least a portion of a bottom surface of the PV module. In some embodiments, the substrate forms the entire bottom surface of the PV module. In some embodiments, the superstrate forms at least a portion of a top surface of the PV module. In some embodiments, the superstrate forms the entire top surface of the PV module.

Figure 3:
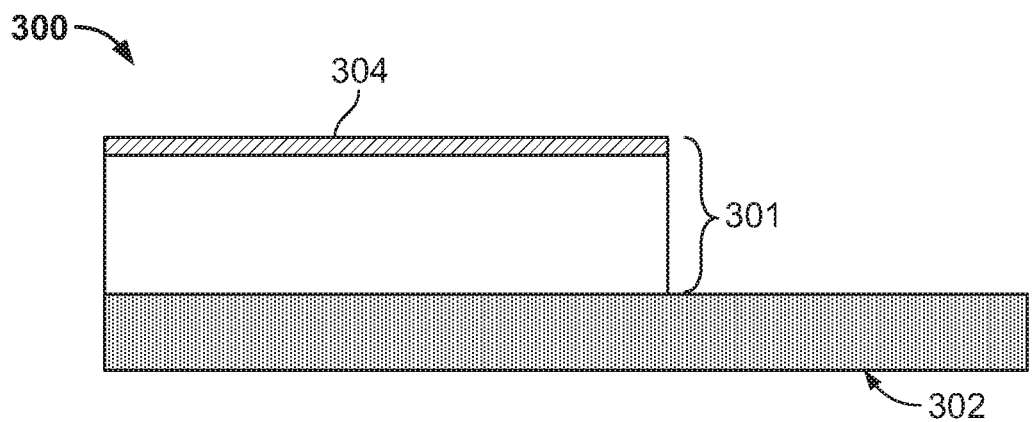

In some embodiments, the bottom surface of the PV module does not comprise a substrate. In some embodiments, the roofing shingle is bonded to the bottom surface of the PV module, such that the roofing shingle replaces the substrate of the PV module. A non-limiting example of an embodiment where a roofing shingle replaces the substrate of a PV module is shown in FIG. 3 and described in more detail below.

In some embodiments, the top surface of the PV module does not comprise a substrate. In some embodiments, the roofing shingle is bonded to the top surface of the PV module, such that the roofing shingle replaces the superstrate of the PV module.

Figure 4:
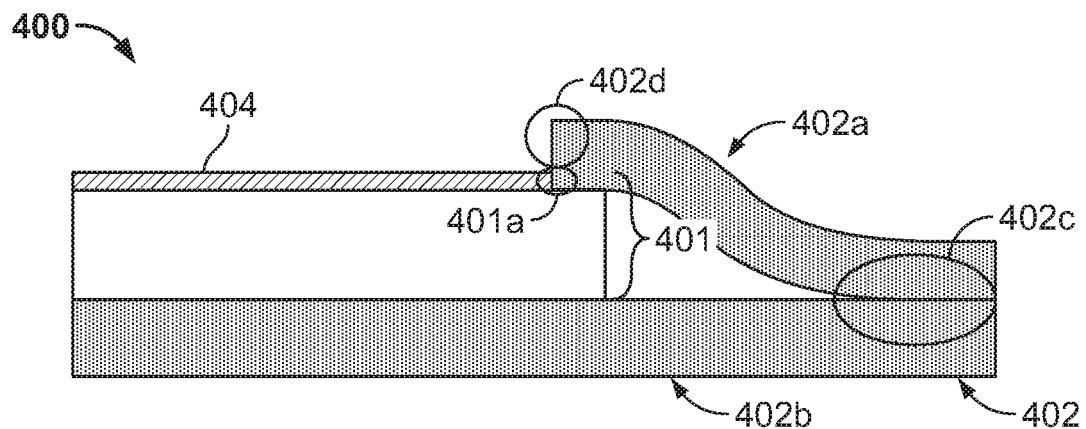

In some embodiments, the top surface of the PV module comprises a first portion and a second portion. In some embodiments, the second portion of the top surface of the PV module is adjacent to the first portion of the top surface. In some embodiments, the first portion of the top surface of the PV module comprises the superstrate. In some embodiments, the second portion of the top surface of the PV module does not comprise the superstrate. In some embodiments, the roofing shingle is bonded to the second portion of the top surface of the PV module, such that the roofing shingle replaces the superstrate on the second portion of the top surface of the PV module. A non-limiting example of an embodiment where a roofing shingle replaces the superstrate on the second portion of the top surface of the PV module is shown in FIG. 4 and described in more detail below.

In some embodiments, the bottom surface of the PV module comprises a first portion and a second portion. In some embodiments, the second portion of the bottom surface of the PV module is adjacent to the first portion of the bottom surface. In some embodiments, the first portion of the bottom surface of the PV module comprises the substrate. In some embodiments, the second portion of the bottom surface of the PV module does not comprise the substrate. In some embodiments, the roofing shingle is bonded to the second portion of the bottom surface of the PV module, such that the roofing shingle replaces the substrate on the second portion of the bottom surface of the PV module.

Some embodiments of the present disclosure relate to a method of manufacturing an integrated PV roofing shingle described herein. In some embodiments, the method comprises obtaining a PV module and a roofing shingle. In some embodiments, the method comprises bonding the PV module to the roofing shingle, so as to form an integrated PV roofing shingle having a bond strength, between the roofing shingle and the PV module, described herein.

In some embodiments, bonding the PV module to the roofing shingle comprises bonding the PV module to the roofing shingle with a sufficient amount of bonding material, including for example, an adhesive, described herein. In some embodiments, the bonding the PV module to the roofing shingle comprises laminating the PV module to the roofing shingle.

Some embodiments of the present disclosure relate to a method of installing an integrated PV roofing shingle described herein onto a roof. In some embodiments, the method comprises obtaining an integrated PV roofing shingle described herein and affixing the integrated PV roofing shingle to a roof. In some embodiments, the integrated PV roofing shingle described herein is affixed to a specific portion of a roof. In some embodiments, the specific portion of the roof where the integrating roofing shingle is affixed is a roof deck.

In some embodiments, affixing comprises affixing the integrated PV roofing shingle to the roof using at least one fastener. In some embodiments, the at least one fastener is chosen from at least one nail, at least one screw, at least one staple, or any combination thereof. In some embodiments, the fastener is affixed to the roof by driving the fastener through an overlapping area (as defined herein) of the integrated PV roofing shingle and into the roof.

In some embodiments, affixing comprises affixing the integrated PV roofing shingle to the roof using an adhesive. In embodiments, the adhesive may include at least one of: asphaltic adhesives such as rubber polymer modified asphalt, acrylic adhesives, polyurethane adhesives, silicone adhesives, rubber polymer based adhesives, e.g. SBS, SBR, SEBS and SIS, or any combination thereof.

In some embodiments, the integrated PV roofing shingle has from 1 fastener to 5 fasteners per square foot of the integrated PV roofing shingle when the integrated PV roofing shingle is installed on a roof. In some embodiments, the integrated PV roofing shingle has from 2 fasteners to 5 fasteners per square foot of the integrated PV roofing shingle when the integrated PV roofing shingle is installed on a roof. In some embodiments, the integrated PV roofing shingle has from 3 fasteners to 5 fasteners per square foot of the integrated PV roofing shingle when the integrated PV roofing shingle is installed on a roof. In some embodiments, the integrated PV roofing shingle has from 4 fasteners to 5 fasteners per square foot of the integrated PV roofing shingle when the integrated PV roofing shingle is installed on a roof.

In some embodiments, the integrated PV roofing shingle has from 1 fastener to 4 fasteners per square foot of the integrated PV roofing shingle when the integrated PV roofing shingle is installed on a roof. In some embodiments, the integrated PV roofing shingle has from 1 fastener to 3 fasteners per square foot of the integrated PV roofing shingle when the integrated PV roofing shingle is installed on a roof. In some embodiments, the integrated PV roofing shingle has from 1 fastener to 2 fasteners per square foot of the integrated PV roofing shingle when the integrated PV roofing shingle is installed on a roof.

In some embodiments, the integrated PV roofing shingle has from 2 fasteners to 3 fasteners per square foot of the integrated PV roofing shingle when the integrated PV roofing shingle is installed on a roof. In some embodiments, the integrated PV roofing shingle has from 2 fasteners to 4 fasteners per square foot of the integrated PV roofing shingle when the integrated PV roofing shingle is installed on a roof. In some embodiments, the integrated PV roofing shingle has from 3 fasteners to 4 fasteners per square foot of the integrated PV roofing shingle when the integrated PV roofing shingle is installed on a roof.

Some embodiments of the present disclosure relate to a roofing kit. In some embodiments, the roofing kit comprises a plurality of integrated PV roofing shingles described herein. In some embodiments, the roofing kit comprises two integrated PV roofing shingles described herein. In some embodiments, the roofing kit comprises three integrated PV roofing shingles described herein. In some embodiments, the roofing kit comprises four integrated PV roofing shingles described herein. In some embodiments, the roofing kit comprises five integrated PV roofing shingles described herein. In some embodiments, the roofing kit comprises six integrated PV roofing shingles described herein. In some embodiments, the roofing kit comprises seven integrated PV roofing shingles described herein. In some embodiments, the roofing kit comprises eight integrated PV roofing shingles described herein. In some embodiments, the roofing kit comprises nine integrated PV roofing shingles described herein. In some embodiments, the roofing kit comprises ten integrated PV roofing shingles described herein. In some embodiments, the roofing kit comprises twenty integrated PV roofing shingles described herein. In some embodiments, the roofing kit comprises thirty integrated PV roofing shingles described herein. In some embodiments, the roofing kit comprises forty integrated PV roofing shingles described herein. In some embodiments, the roofing kit comprises fifty integrated PV roofing shingles described herein. In some embodiments, the roofing kit comprises one-hundred integrated PV roofing shingles described herein. In some embodiments, the roofing kit comprises five-hundred integrated PV roofing shingles described herein.

In some embodiments, each integrated PV roofing shingle of the roofing kit is configured to be affixed to a roof by at least one fastener described herein.

The present disclosure will now be described with reference to several non-limiting exemplary embodiments.

FIG. 1 depicts an illustrative non-limiting exemplary embodiment of an integrated PV roofing shingle according to the present disclosure shown in cross-section. As shown in FIG. 1, an integrated PV roofing shingle 100 may comprise a PV module 101 bonded to a roofing shingle 102. In some embodiments, the integrated PV roofing shingle 100 may comprise a bonding material 103 between the roofing shingle 102 and the PV module 101. In some embodiments, the PV module 101 of the integrated PV roofing shingle 100 may comprise a superstrate 104 and a substrate 105.

Figure 2:
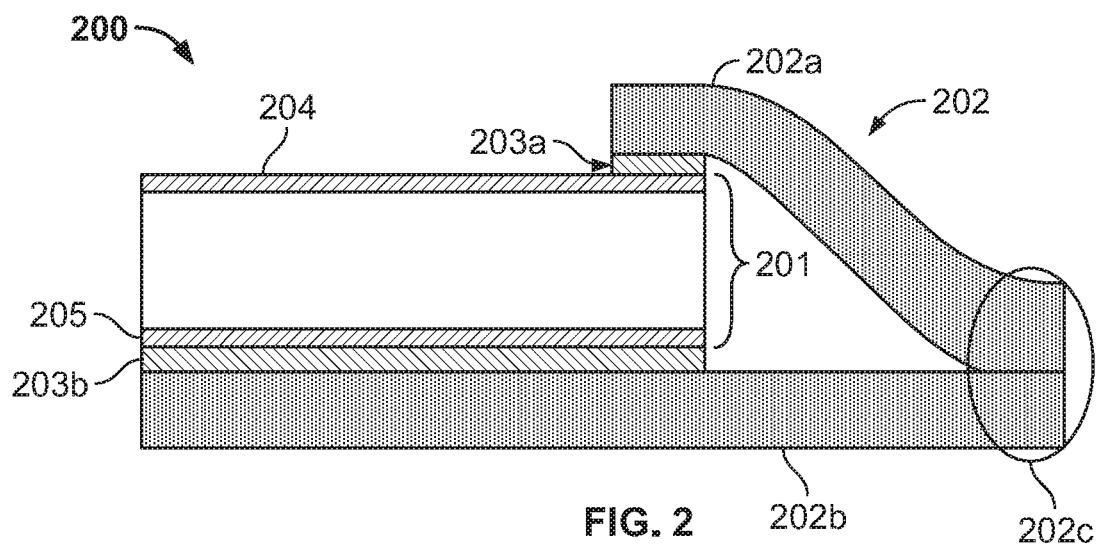

FIG. 2 depicts an illustrative non-limiting exemplary embodiment of an integrated PV roofing shingle according to the present disclosure, also shown in cross-section. As shown in FIG. 2, integrated PV roofing shingle 200 may comprise a PV module 201 bonded to a roofing shingle 202. Roofing shingle 202 may, in some embodiments, comprise two portions-first portion 202a and second portion 202b. In some embodiments, first portion 202a is a top portion as shown. In some embodiments, second portion 202b is a bottom portion as shown. However, this configuration is not limiting. The first portion 202a and second portion 202b of the roofing shingle 202 may, in some embodiments, be in contact at overlapping area 202c. In some embodiments, at least one fastener (not shown) may be driven into overlapping area 202c, so as to affix integrated PV roofing shingle 200 to a roof (not shown). In some embodiments, the integrated PV roofing shingle 200 may comprise a first bonding material 203a and a second bonding material 203b. In some embodiments, first bonding material 203a and second bonding material 203b are the same. In some embodiments, first bonding material 203a and second bonding material 203b are different. In some embodiments, the PV module 201 of the integrated PV roofing shingle 200 may comprise a superstrate 204 and a substrate 205. In some embodiments, first bonding material 203a is disposed between the superstrate 204 and the first portion 202a of the roofing shingle 202. In some embodiments, second bonding material 203b is disposed between the substrate 205 and the first portion 202b of the roofing shingle 202.

FIG. 3 depicts an illustrative non-limiting exemplary embodiment of an integrated PV roofing shingle according to the present disclosure, also in cross-section. As shown in FIG. 3, integrated PV roofing shingle 300 may comprise a PV module 301 bonded to a roofing shingle 302. In some embodiments, the PV module 301 of the integrated PV roofing shingle 300 may comprise a superstrate 304. In some embodiments, the PV module 301 of the integrated PV roofing shingle 300 may not include a substrate, such that the roofing shingle 302 replaces the substrate, as shown.

FIG. 4 depicts an illustrative non-limiting exemplary embodiment of an integrated PV roofing shingle according to the present disclosure in cross-section. Roofing shingle 402 may, in some embodiments, comprise two portions—first portion 402a and second portion 402b. The first portion 402a and second portion 402b of the roofing shingle 402 may, in some embodiments, be in contact at overlapping area 402c. In some embodiments, a fastener (not shown) may be driven into overlapping area 402c, so as to affix integrated PV roofing shingle 400 to a roof (not shown). In some embodiments, the PV module 401 of the integrated PV roofing shingle 400 may comprise a superstrate 404. In some embodiments, a top portion 401a of the PV module 401 does not comprise the superstrate 404. In some such embodiments, a portion of the superstrate 404 is replaced with portion 402d of the roofing shingle 402 on top portion 401a of the PV module as shown. In some embodiments, the portion 402d of the roofing shingle 402 that is disposed on top portion 401a of the PV module 401 is adjacent to the superstrate 404 as shown.

Figure 5:
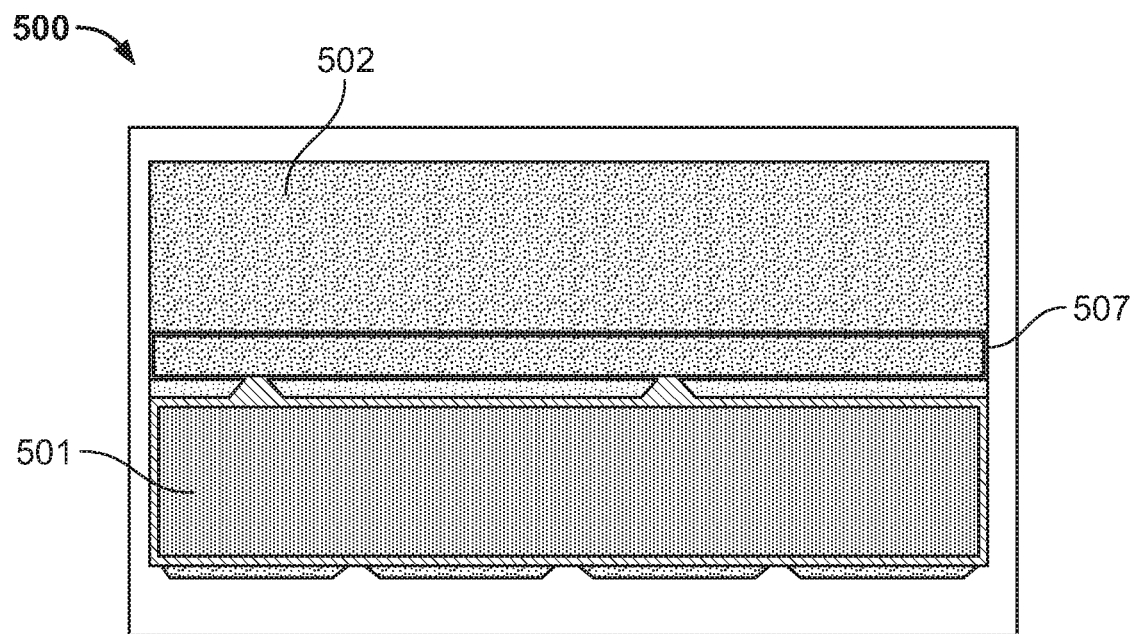
FIG. 5 is a top view of an illustrative non-limiting exemplary embodiment of an integrated PV roofing shingle according to the present disclosure.

FIG. 5 depicts a top view of an illustrative non-limiting exemplary embodiment of an integrated PV roofing shingle according to the present disclosure. As shown in FIG. 5, integrated PV roofing shingle 500 may comprise a PV module 501 bonded to a roofing shingle 502. In some embodiments, integrated PV roofing shingle 500 may comprise a fastener application area 507.

Variations, modifications and alterations to embodiments of the present disclosure described above will make themselves apparent to those skilled in the art. All such variations, modifications, alterations and the like are intended to fall within the spirit and scope of the present disclosure, limited solely by the appended claims.

While several embodiments of the present disclosure have been described, it is understood that these embodiments are illustrative only, and not restrictive, and that many modifications may become apparent to those of ordinary skill in the art. For example, all dimensions discussed herein are provided as examples only, and are intended to be illustrative and not restrictive.

Any feature or element that is positively identified in this description may also be specifically excluded as a feature or element of an embodiment of the present as defined in the claims.

The disclosure described herein may be practiced in the absence of any element or elements, limitation or limitations, which is not specifically disclosed herein. Thus, for example, in each instance herein, any of the terms "comprising," "consisting essentially of and "consisting of" may be replaced with either of the other two terms, without altering their respective meanings as defined herein. The terms and expressions which have been employed are used as terms of description and not of limitation, and there is no intention in the use of such terms and expressions of excluding any equivalents of the features shown and described or portions thereof, but it is recognized that various modifications are possible within the scope of the disclosure.

The invention claimed is:

1. A system, comprising:
a plurality of photovoltaic (PV) roofing shingles installed on a roof deck,
wherein the plurality of PV roofing shingles comprises at least a first PV roofing shingle and a second PV roofing shingle,
wherein each of the plurality of PV roofing shingles comprises:
a PV module;
wherein the PV module comprises:
a superstrate,
a first layer, and
a substrate,
wherein the first layer is between the superstrate and the substrate,
wherein each of the superstrate and the substrate comprises at least one material from the group consisting of a thermoplastic polyolefin, ethylene tetrafluoroethylene, polyolefin encapsulant, ethylene vinyl acetate encapsulant, and acrylics; and
a roofing layer comprising a first end, a second end opposite to the first end, a first edge extending between the first end and the second end, a second edge opposite to the first edge and extending between the first end and the second end, a substantially flat top surface, and a substantially flat bottom surface opposite the substantially flat top surface,
wherein the substantially flat top surface defines a fastener application area,
wherein the fastener application area is spaced apart from the first edge and from the second edge,
wherein the fastener application area extends from the first end of the roofing layer to the second end of the roofing layer,
wherein the substantially flat bottom surface of the first PV roofing shingle overlaps and defines an interface with the substantially flat top surface of the second PV roofing shingle, and
at least one fastener,
wherein the at least one fastener penetrates the fastener application area of at least one of the first PV roofing shingle or the second PV roofing shingle, thereby to fasten the first PV roofing shingle or the second PV roofing shingle to the roof deck,
wherein the roofing layer of the first PV roofing shingle partially overlaps and is in contact with the roofing layer of the second PV roofing shingle.

2. The system of claim 1, wherein each of the plurality of PV roofing shingles further comprises:
a bonding material,
wherein the bonding material is between the substantially flat top surface of the roofing layer and a bottom surface of the substrate of the PV module.

3. The system of claim 1, wherein the roofing layer of each of the plurality of PV roofing shingles comprises a roofing shingle.

4. The system of claim 1, wherein in each of the plurality of PV roofing shingles the PV module is laminated to the roofing layer.

5. The system of claim 1, wherein the roofing layer of each of the plurality of PV roofing shingles comprises TPO.

6. The system of claim 1, wherein each of the plurality of PV roofing shingles further comprises:
an adhesive on a bottom surface of the roofing layer.

7. The system of claim 1, wherein an entirety of the fastener application area is configured to receive a fastener.

8. The system of claim 1, wherein the roofing layer has a substantially constant thickness.

9. The system of claim 1, wherein the roofing layer has a substantially constant thickness from the first end to the second end, and from the first edge to the second edge.

10. A system, comprising:
a plurality of photovoltaic (PV) roofing shingles installed on a roof deck,
wherein the plurality of PV roofing shingles comprises at least a first PV roofing shingle and a second PV roofing shingle,
wherein each of the plurality of PV roofing shingles comprises:
a PV module;
wherein the PV module comprises:
a superstrate,
a first layer, and
a substrate,
wherein a surface of the superstrate is juxtaposed with a surface of the first layer,
wherein another surface of the first layer is juxtaposed with a surface of the substrate,
wherein each of the superstrate and the substrate comprises at least one material from the group consisting of a thermoplastic polyolefin, ethylene tetrafluoroethylene, polyolefin encapsulant, ethylene vinyl acetate encapsulant, and acrylics; and
a roofing layer comprising a first end, a second end opposite to the first end, a first edge extending between the first end and the second end, a second edge opposite to the first edge and extending between the first end and the second end, a substantially flat top surface, and a substantially flat bottom surface opposite the substantially flat top surface, wherein the substantially flat top surface of the roofing layer is juxtaposed with the substrate of the PV module,
wherein the substantially flat top surface defines a fastener application area,
wherein the fastener application area is spaced apart from the first edge and from the second edge,
wherein the fastener application area extends from the first end of the roofing layer to the second end of the roofing layer,
wherein the substantially flat bottom surface of the first PV roofing shingle overlaps and defines an interface with the substantially flat top surface of the second PV roofing shingle, and
at least one fastener,
wherein the at least one fastener penetrates the fastener application area of at least one of the first PV roofing shingle or the second PV roofing shingle, thereby to fasten the first PV roofing shingle or the second PV roofing shingle to the roof deck,
wherein the roofing layer of the first PV roofing shingle partially overlaps and is in contact with the roofing layer of the second PV roofing shingle.

11. The system of claim 10, wherein each of the plurality of PV roofing shingles further comprises:
a bonding material,
wherein the bonding material is between the substantially flat top surface of the roofing layer and a bottom surface of the substrate of the PV module.

12. The system of claim 10, wherein the roofing layer of each of the plurality of PV roofing shingles comprises a roofing shingle.

13. The system of claim 10, wherein in each of the plurality of PV roofing shingles the PV module is laminated to the roofing layer.

14. The system of claim 10, wherein the roofing layer of each of the plurality of PV roofing shingles comprises TPO.

15. The system of claim 10, wherein each of the plurality of PV roofing shingles further comprises:
an adhesive on a bottom surface of the roofing layer.

16. The system of claim 10, wherein an entirety of the fastener application area is configured to receive a fastener.

17. The system of claim 11, wherein the roofing layer has a substantially constant thickness.

18. The system of claim 11, wherein the roofing layer has a substantially constant thickness from the first end to the second end, and from the first edge to the second edge.

* * * * *